United States Patent [19]

Solie et al.

[11] Patent Number: 4,767,198
[45] Date of Patent: Aug. 30, 1988

[54] SAW/BAW BRAGG CELL

[75] Inventors: Leland P. Solie, Mahomet, Ill.; Joseph H. Labrum, W. Jordan, Utah

[73] Assignee: Unisys Corporation, Blue Bell, Pa.

[21] Appl. No.: 65,983

[22] Filed: Jun. 24, 1987

[51] Int. Cl.$^4$ .......................... G02F 1/11; G02F 1/33
[52] U.S. Cl. .................................... 350/358; 350/353
[58] Field of Search ............... 350/358, 353; 332/7.51

[56] References Cited

U.S. PATENT DOCUMENTS

| | | | |
|---|---|---|---|
| 3,568,102 | 3/1971 | Tseng | 333/153 |
| 3,675,054 | 7/1972 | Jones et al. | 310/9.8 |
| 3,717,819 | 2/1973 | Adler | 330/5.5 |
| 3,742,396 | 6/1973 | Bahr et al. | 333/30 |
| 3,753,164 | 8/1973 | DeVries | 333/153 |
| 3,975,697 | 8/1976 | Paige | 310/313 D X |
| 4,016,514 | 4/1977 | Reeder et al. | 333/30 |
| 4,166,228 | 8/1979 | Solie | 310/313 D |
| 4,281,407 | 7/1981 | Tosima | 369/131 |
| 4,288,765 | 9/1981 | Mikoshiba et al. | 333/195 |
| 4,354,166 | 10/1982 | Grudkowski | 331/107 |
| 4,357,553 | 11/1982 | Minagawa et al. | 310/313 |
| 4,477,784 | 10/1984 | Maerfeld et al. | 333/154 |
| 4,477,892 | 10/1984 | Tosima et al. | 369/132 |
| 4,521,751 | 6/1985 | Riha et al. | 333/151 |
| 4,532,632 | 7/1985 | Yamashita et al. | 350/358 |
| 4,633,118 | 1/1987 | Means et al. | 330/5.5 |
| 4,635,008 | 1/1987 | Solie | 333/195 |
| 4,636,678 | 1/1987 | Ballato | 310/313 |
| 4,638,266 | 1/1987 | Aiich et al. | 332/7.51 |
| 4,639,092 | 1/1987 | Gottlieb et al. | 350/372 |

FOREIGN PATENT DOCUMENTS 0140325 7/1985 Japan .................................. 350/358

Primary Examiner—Eugene R. LaRoche
Assistant Examiner—Nathan W. McCutcheon
Attorney, Agent, or Firm—Glenn W. Bowen; Laurence J. Marhoefer

[57] ABSTRACT

An acoustic signal is launched as a surface acoustic wave (SAW) by a hyperbolically tapered transducer and then reflected into a bulk acoustic wave (BAW) by a tapered reflector. At each frequency the tapered reflector must satisfy the phase match conditions between the SAW and BAW as defined by their wave vectors. Let $k_B$ be the projection of the BAW wave vector on the surface, and let $k_S$ be the wave vector of the SAW. Then, if $k_G$ is defined to be the wave vector of the grid, i.e., $k_G = 2\pi/d$, where d is the periodicity of the reflecting strips at the frequency under consideration, the phase match condition is $k_G = k_B - k_S$. A reflector designed to satisfy this condition will reflect the SAW into a BAW at any desired angle (as specified by $k_B$). The laser beam is then Bragg scattered by the BAW in the usual manner. The advantage of this scheme is that the tapered transducer separates the acoustic signals spatially so no intermodulation products are formed. Furthermore, the tapered transducers are able to handle higher power levels than other transducers so high acoustic signals can, in fact, be used. An additional improvement in Bragg scattering efficiency can be achieved by curving the reflective array in such a way as to direct the BAW so that the Bragg angle for optimum scattering efficiency is exactly met for all frequencies. This insures that the device can be used over a broad bandwidth without a fall off in the Bragg scattering efficiency.

8 Claims, 3 Drawing Sheets

SAW/BAW BRAGG CELL

BACKGROUND OF THE INVENTION

Typical Bragg cell modulators utilize a surface acoustical wave (SAW) transducer which is positioned on the surface of the material which conducts the acoustical waves that interact with various frequency light wave signals that pass through the device are deflected at their Bragg angle due to the interaction the light frequency waves with the surface acoustical waves. In conventional acousto-optic Bragg cells, whether using surface waves or bulk acoustical waves, (BAW) there is a limitation on the achievable dynamic range due to the generation of intermodulation products. If two signals $f_1$ and $f_2$ are present simultaneously there will be inter mod acoustic product signals at $2f_1-f_2$ and $2f_2-f_1$. In order to maximize the Bragg efficiency and thus the dynamic range, it is desirable to use high power levels in the acoustic signal, but this increases the intermodulation signal levels. (For example, if $f_1$ and $f_2$ are increased by 10 dB, the intermodulation product $2f_1-f_2$ increases by 30 dB.)

Thus, low acoustic power and dynamic range is limited by noise and at high acoustic power by intermodulation products.

The SAW/BAW device of the present invention utilizes a surface transducer of a specially constructed form. The transducer has hyperbolically tapered fingers and is constructed in a manner similar to that shown in U.S. Pat. No. 4,635,008, which was invented by the inventor of the present invention, and is assigned to the assignee of the present invention. This transducer has a number of hyperbolically tapered interdigital fingers which are separated from each other in such a manner that the frequencies launched by the transducer or are received by the transducer, vary from high frequencies at one end of the transducer where the electrode fingers are closely spaced together, to lower frequencies at the opposite end of the transducer where the fingers are more widely separated. The surface acoustical waves that are, therefore, launched by this transducer vary in a like manner as they travel across the surface of the Bragg cell.

A number of reflecting elements are placed in the paths of the SAW's which are preferably spaced-apart, elongated, thin, rectangular reflector elements. These elements may be formed by deposited metal on the surface of the cell, or they may be grooves in the surface, or they may be formed by other conventional means known to those skilled in the art. The Bragg cell of this invention is several times thicker than a conventional normal SAW Bragg cell. In the typical SAW Bragg cell, the structure is relatively thin in order to minimize the effects of bulk waves. However, in the device of the present invention, the reflecting elements are utilized to deliberately deflect a portion of the energy of the incoming SAW's into BAW's which will traverse the cell at an inclined direction into the bulk of the material. The present invention, thereby, provides wide separation of the various frequency components of the impinging light and hence minimizes intermodulation products which limit the dynamic range of present Bragg cells. In addition, SAW to BAW conversion techniques allow for planar construction which is relatively less expensive. The ability of the device to satisfy the Bragg condition over the entire bandwidth increases the useful bandwidth of such devices and increases the efficiency of the Bragg scattering process.

BRIEF DESCRIPTION OF THE DRAWINGS

The present invention is disclosed by reference to the drawings in which.

TECHNICAL DESCRIPTION OF THE INVENTION

Figure 1:
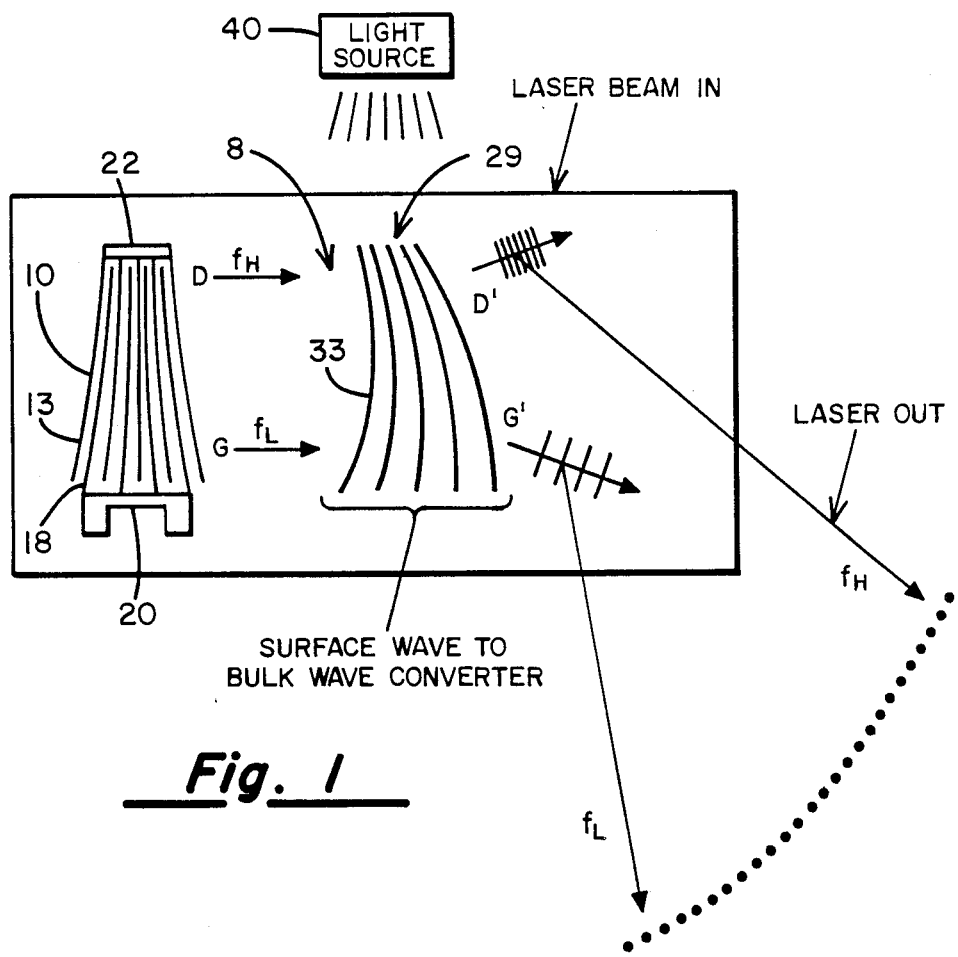
FIG. 1 is a top view of a SAW/BAW device constructed in accordance with the present invention.

FIG. 1 illustrates a SAW/BAW crystal 8 which is suitable for the present invention. A hyperbolically shaped transducer 10, formed of deposited metallic conductors, is positioned on its upper surface 13. The transducer 10 has a long electrode 20 at one end and a shorter electrode 22 at its opposite end. A number of hyperbolically shaped transducer fingers 13 are connected to the long electrode, and another set of interdigitized hyperbolically shaped transducer fingers 18 are connected to the longer electrode. The fingers 18, 20 are spaced apart so that near the shorter electrode a high frequency signal will be launched, and near the longer electrode a lower frequency signal will be transmitted. Thus, along the intermediate portion of the transducer a linear variation of frequency with spacing occurs as one moves from the shorter to the longer electrode. The shortest wavelengths that are produced are represented by the arrow G, and the longest wavelengths are represented by the arrow D. All of the SAW waves are transported across the surface of the cell toward the reflector elements 29. The reflector elements 29 are elongated deposited conductors or grooves formed in the surface, and are utilized to deflect the surface acoustic waves down into the bulk of the material and as indicated by the arrow G' for the shortest wavelength and the arrow D' for the longest wavelength signal. The reflector elements 33 are preferably shaped in a curved manner to the separation between the elements 33 at the top and are the same as the separation between the fingers of the transducer 10 at the high frequency end of the transducer. The spacing of the elements 29 then varies in a linear manner in correspondence with the spacing of the fingers of the transducer 10 from the high frequency end to the low frequency end of the transducer to obtain a frequency match across the entire SAW area.

The SAW's are deflected and BAW's are generated in the bulk of the Bragg cell, and the wave fronts of the BAW's then interact with the incoming of light source, such as the light source 40. The light rays coming out of the Bragg cell will then be widely dispersed with the low frequency signal displaced substantially from the high frequency signal, and intermediate frequency signals dispersed in a linear manner between the high and low frequencies.

Figure 2:
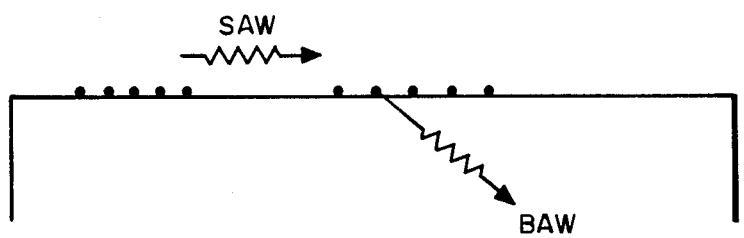
FIG. 2 is a side view of the device of FIG. 1.
Figure 3:
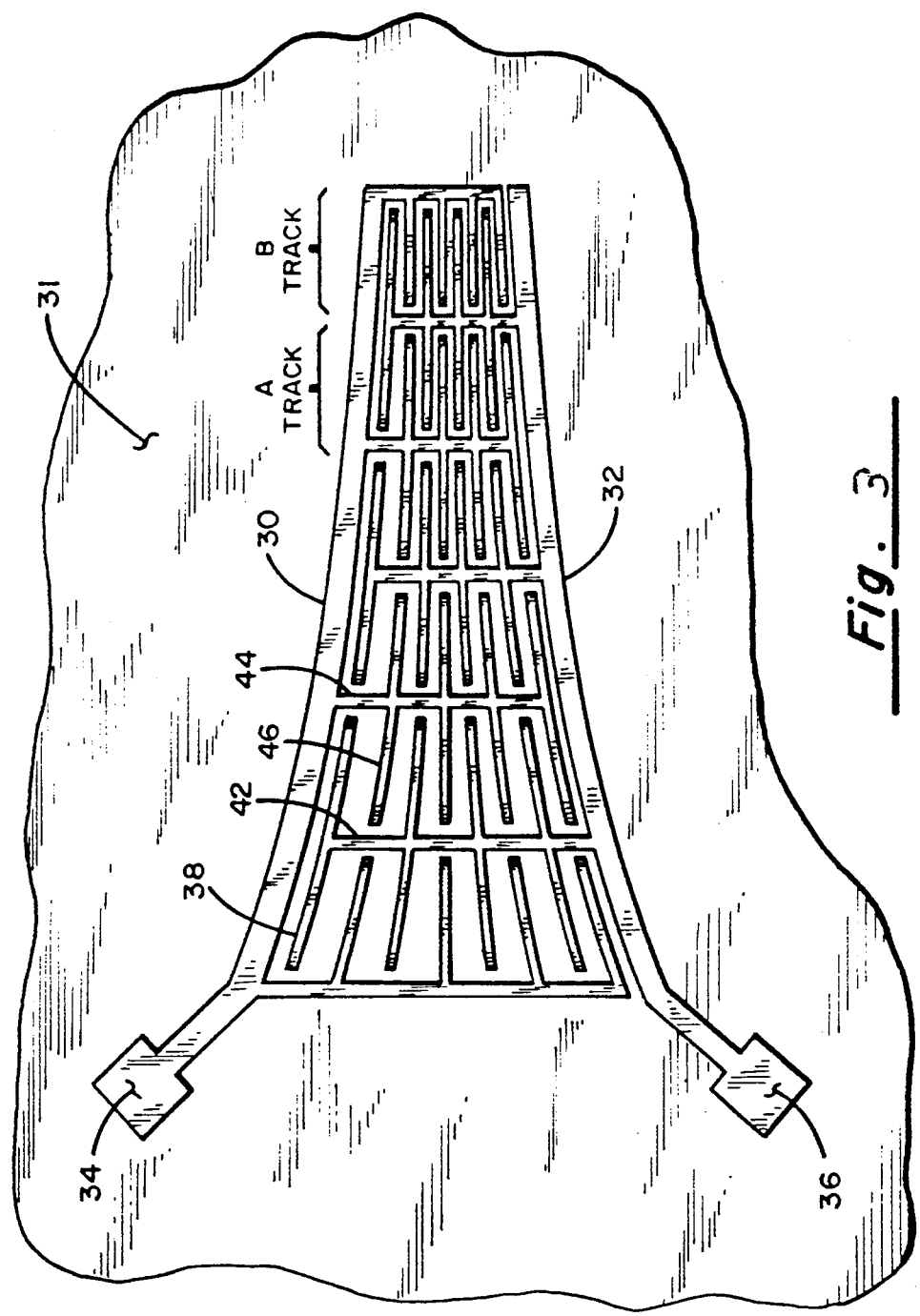
FIG. 3 shows an alternate version of the transducer that may be used in the device.

FIG. 3 shows a modification of the transducers with hyperbolic shaped electrode fingers of FIGS. 1 and 2 which may be utilized when it is necessary to further reduce the insertion loss for such transducers. This modification involves the segmenting of the fingers of the transducer so that only the two outer, widened electrode fingers 30 and 32, (on a suitable substrate 31, such as a piezoelectric acoustic-wave-propagating medium, or other substrate known to be suitable for the purpose) connect to the opposite electrode pads 34 and 36 respectively, and extend along the entire length of the transducer. The remaining inner electrodes, such as the electrodes 38 and 46, extend along only a portion of the outer fingers 30 and 32, and are connected to their respective outer fingers through crossbeams, such as the crossbeams 42, 44. By segmenting the inner electrode segments, and by increasing the width of the outer electrodes 30 and 32, a decrease in electrode resistance is obtained which allows the width of the inner electrodes to be sufficiently narrow to produce a transducer which does not have substantially different acoustic impedance than the transducer of FIGS. 1 and 2. The electrical parasitic resistance, however, is approximately decreased by $N^2$ over this transducer, where N is the number of segments, such as the electrode 38 into which each finger electrode is divided. For example, in the embodiment shown in FIG. 3 where there are six segments, the electrode resistance will be approximately 1/36 of the resistance of the transducer shown in FIGS. 1 and 2.

Figure 4:
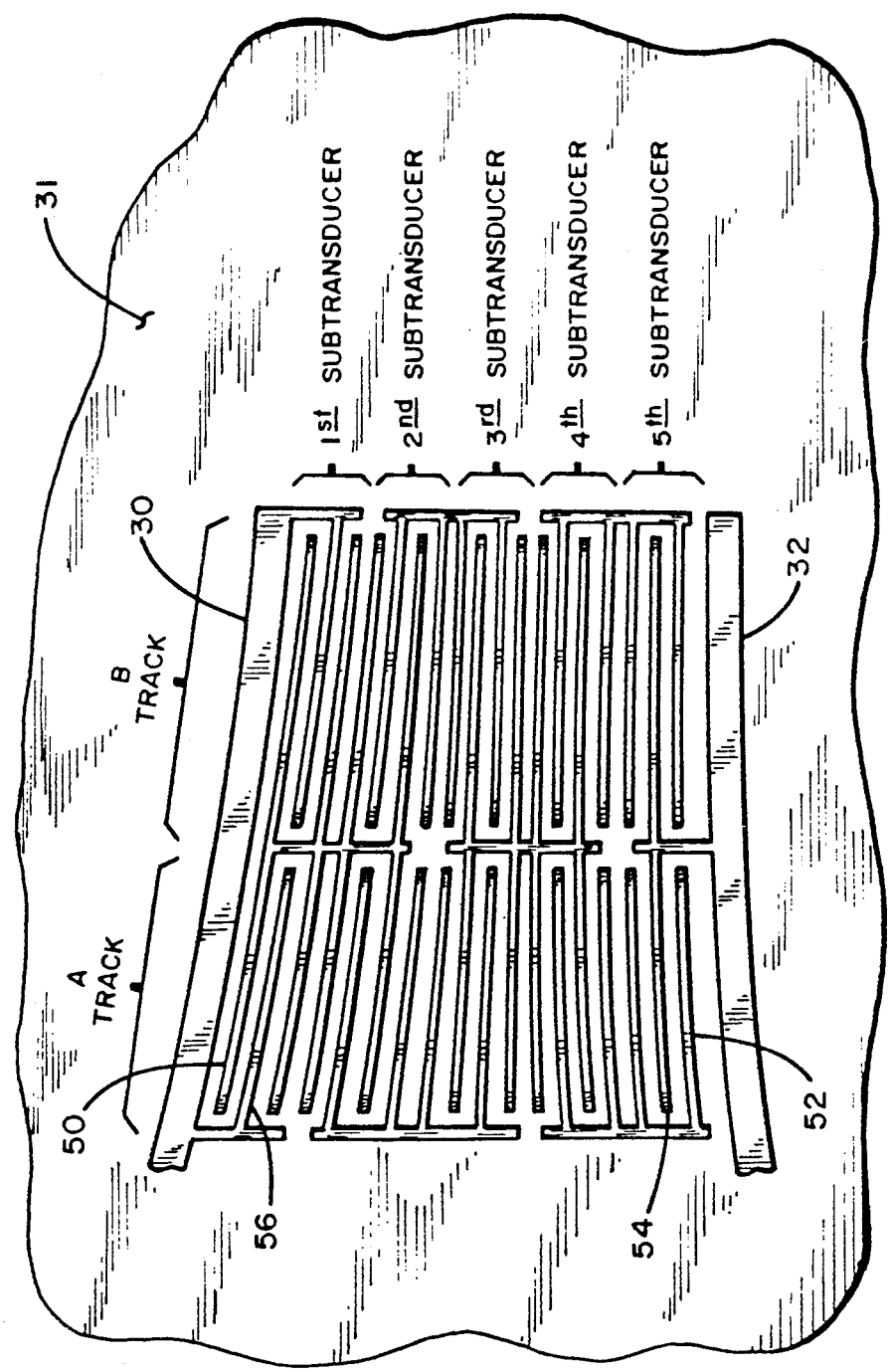
FIG. 4 shows another alternate version of a transducer that may be used in the device.

FIG. 4 shows another modification in which each segment of the transducer may be subdivided to provide a number of subtransducers across the outer electrodes. The showing of FIG. 4, for simplification, illustrates only two tracks of the transducer, which correspond to the tracks between the lines A and B of FIG. 3. Interconnections in these tracks provide a number of capacitively coupled, floating electrode subtransducers. For example, in FIG. 4 there are five subtransducers in each track which are connected in series to provide a voltage dividing path between the electrodes 30, 32. For example, capacitive coupling occurs between sections 30 and 50, 32 and 52, 52 and 54, 50 and 56, etc., of FIG. 4. By using the electrodes of the transducer of FIG. 4, the acoustic impedance is increased by factor $N^2$, where N is the number of subtransducers of each track, over the acoustic impedance of the transducer of FIG. 3. Thus, in the illustrated embodiment of FIG. 4, the acoustic impedance is increased by a factor of 25, as compared to a transducer with the same number of electrodes but with only one subtransducer per segment as in FIG. 3.

Hyperbolically tapered transducers are preferred for use in the present invention and, as described above, since conventional parallel straight line transducer fingers will not provide a wideband response. A Bragg cell modulation may be implemented, however, with transducers and reflectors which have curved fingers which are not hyperbolically tapered, but which may approximate a flatter frequency response than can be obtained with conventional configurations. An example of the construction of transducers with curved fingers is shown in the article entitled "Improved Modeling of Wideband Linear Phase SAW Filters Using Transducers with Curved Fingers" by N. J. Slater and C. K. Campbell, which was published in IEEE Transactions on Sonics and Ultrasonics, Vol. SU-31, No. 1, January 1984, pages 46–50. If such a configuration is substituted for the hyperbolically tapered fingers of the elements of the preferred embodiment, however, there will be some compromise in bandwidth.

A transducer with straight-slanted fingers is described in the article "Wideband Linear SAW Filters Using Apodized Slanted Finger Transducers" by P. M. Naraine and C. K. Campbell in IEEE Ultrasonics Symposium Proceedings, 1983, pages 113–116. The slanted finger to digital transducer structure described in this article employed straight-slanted fingers which emanated from a common focal point in an effort to yield flat amplitude response across a passband. Apodization of the device was derived from a computer optimization routine to compensate for the inherent negative amplitude slope of an unapodized slanted finger transducer so that external amplitude equalization circuits were not needed. In this configuration, however, an even greater sacrifice of bandwidth will occur, although the construction of the transducer is somewhat simpler. The reflective elements then would also be slanted, straight elements.

What is claimed is:

1. A Bragg cell modulator comprising
   a surface acoustical wave (SAW) and bulk acoustical wave (BAW) conducting substrate in which Bragg cell modulation of light waves from an external source occurs,
   a transducer formed of interdigital, electrode fingers located on one surface of said substrate for launching SAW's wherein said fingers exhibit a variable separation along the length of said transducer, and
   BAW generator means comprising a plurality of spaced-apart elongated elements positioned to intercept said SAW's and to generate BAW's in said substrate which modulate said light waves, wherein each of said elongated elements are spaced from each other by a distance that substantially matches the variation in spacing that exists between said fingers of said transducer so that each frequency component of said SAW that is launched at a given area of said transducer generates substantially the same frequency components of said BAW at the area where said frequency component of said SAW is received by said elongated elements, and the frequency components of said modulated light waves are spatially dispersed in said substrate in a substantially linear manner between the highest frequency BAW modulated component and the lowest frequency BAW modulated component.

2. A Bragg cell modulator as claimed in claim 1 wherein said curved interdigital electrode fingers are each formed as segments of hyperbolic curves positioned such that the spacing between said fingers varies from point-to-point along said transducer and the spacing between said fingers is substantially constant at any given point.

3. A Bragg cell modulator as claimed in claim 2 wherein said curved electrode fingers comprise a pair of outer electrode fingers and a plurality of inner electrode fingers, said outer electrode fingers are relatively wider than said inner electrode fingers, said inner electrode fingers are subdivided into a plurality of hyperbolic curved sections, and said transducer comprises interconnection electrode connection means for connecting each of said sections to one of said outer electrode fingers.

4. A Bragg cell modulator as claimed in claim 3 wherein said transducer is divided into a plurality of tracks, and each of said tracks is subdivided into a plurality of subtransducer elements which comprise floating electrode fingers which are not connected to either of said outer electrode fingers but which are configurated so they capacitively couple subtransducers that are a given track in electrical series.

5. A Bragg cell modulator as claimed in claim 1 wherein said elongated elements are curved elements.

6. A Bragg cell modulator as claimed in claim 5 wherein said curved interdigital electrode fingers are each formed as segments of hyperbolic curves positioned such that the spacing between said fingers varies from point-to-point along said transducer and the spacing between said fingers is substantially constant at any given point.

7. A Bragg cell modulator as claimed in claim 6 wherein said curved electrode fingers comprise a pair of outer electrode fingers and a plurality of inner electrode fingers, said outer electrode fingers are relatively wider than said inner electrode fingers, said inner electrode fingers are subdivided into a plurality of hyperbolic curved sections, and said transducer comprises interconnection electrode connection means for connecting each of said section to one of said outer electrode fingers.

8. A Bragg cell modulator as claimed in claim 7 wherein said transducer is divided into a plurality of tracks, and each of said tracks is subdivided into a plurality of subtransducer elements which comprise floating electrode fingers which are not connected to either of said outer electrode fingers but which are configured so they capacitively couple subtransducers that are a given track in electrical series.

* * * * *

UNITED STATES PATENT AND TRADEMARK OFFICE
CERTIFICATE OF CORRECTION

PATENT NO. : 4,767,198

DATED : August 30, 1988

INVENTOR(S) : Leland P. Solie and Joseph H. Labrum

It is certified that error appears in the above-identified patent and that said Letters Patent are hereby corrected as shown below:

Column 2, line 55, delete "of".

Signed and Sealed this

Tenth Day of January, 1989

Attest:

DONALD J. QUIGG

*Attesting Officer*  *Commissioner of Patents and Trademarks*